United States Patent
Botman

(10) Patent No.: US 10,415,133 B2
(45) Date of Patent: Sep. 17, 2019

(54) ADAPTIVE BEAM CURRENT FOR HIGH THROUGHPUT PATTERNING

(71) Applicant: FEI Company, Hillsboro, OR (US)

(72) Inventor: Aurelien Philippe Jean Maclou Botman, Portland, OR (US)

(73) Assignee: FEI Company, Hillsboro, OR (US)

( * ) Notice: Subject to any disclaimer, the term of this patent is extended or adjusted under 35 U.S.C. 154(b) by 92 days.

(21) Appl. No.: 15/199,690

(22) Filed: Jun. 30, 2016

(65) Prior Publication Data
US 2017/0002455 A1 Jan. 5, 2017

Related U.S. Application Data

(60) Provisional application No. 62/188,362, filed on Jul. 2, 2015.

(51) Int. Cl.
| | |
|---|---|
| *C23C 14/22* | (2006.01) |
| *C23C 14/30* | (2006.01) |
| *C23C 14/54* | (2006.01) |
| *C23C 16/04* | (2006.01) |
| *C23C 16/48* | (2006.01) |

(52) U.S. Cl.
CPC ............ *C23C 14/221* (2013.01); *C23C 14/30* (2013.01); *C23C 14/54* (2013.01); *C23C 16/047* (2013.01); *C23C 16/486* (2013.01); *H01J 2237/31732* (2013.01)

(58) Field of Classification Search
CPC ....... C23C 14/221; C23C 14/30; C23C 14/54; C23C 16/047; C23C 16/486
See application file for complete search history.

(56) References Cited

U.S. PATENT DOCUMENTS

| | | |
|---|---|---|
| 5,851,413 A | 12/1998 | Casella et al. |
| 6,042,738 A | 3/2000 | Casey et al. |
| 8,853,078 B2 | 10/2014 | Botman et al. |
| 2001/0017739 A1 | 8/2001 | Krans et al. |
| 2001/0045525 A1* | 11/2001 | Gerlach ............. H01J 37/3007 250/492.1 |
| 2004/0099636 A1* | 5/2004 | Scipioni ............. B81C 1/00547 216/66 |
| 2004/0129351 A1* | 7/2004 | Iwasaki ................ C23C 16/047 148/508 |
| 2004/0140438 A1 | 7/2004 | Gerlach et al. |
| 2004/0226814 A1 | 11/2004 | Stewart et al. |
| 2005/0178982 A1 | 8/2005 | Henstra et al. |

(Continued)

FOREIGN PATENT DOCUMENTS

WO    9940234    8/1999

*Primary Examiner* — Kelly M Gambetta

(57) ABSTRACT

A method for planning a beam path for material deposition is provided in which a structure pattern having features of varying size is analyzed to determine the size of each feature. A beam path throughout the structure pattern is determined and the beam current required for each point in the structure pattern is configured. Configuring the beam current required for each point involves determining the acceptable beam dose for that point. Relatively small features require a low beam current for high accuracy and relatively large features can be formed using a higher beam current allowing faster deposition. Each feature in the structure pattern is deposited at the highest beam current acceptable to allow accurate deposition of the feature.

16 Claims, 5 Drawing Sheets

(56) References Cited

U.S. PATENT DOCUMENTS

| | | |
|---|---|---|
| 2006/0292709 A1 | 12/2006 | Hoshino et al. |
| 2010/0032567 A1 | 2/2010 | Freitag et al. |
| 2010/0224592 A1 | 9/2010 | Toth et al. |
| 2011/0031394 A1 | 2/2011 | Knowles et al. |
| 2011/0084207 A1 | 4/2011 | Zhang et al. |
| 2012/0217152 A1 | 8/2012 | Miller |
| 2014/0061032 A1 | 3/2014 | Miller et al. |
| 2015/0340235 A1 | 11/2015 | Lee et al. |
| 2015/0369710 A1 | 12/2015 | Fuller et al. |

* cited by examiner

ADAPTIVE BEAM CURRENT FOR HIGH THROUGHPUT PATTERNING

TECHNICAL FIELD OF THE INVENTION

The present invention relates generally to a method and apparatus for depositing material in a pattern.

BACKGROUND OF THE INVENTION

Beam systems, such as electron beam systems, ion beam systems, laser beam systems, cluster beam systems, and neutral particle beam systems, are used to create features on a surface by etching or depositing material. Focused beams are used to remove material from a sample and to deposit material onto the sample. Material can be removed by sputtering, in which the momentum of the particles in the beam physically knock atom or molecules from the sample surface.

A particle or laser beam can be used to induce a chemical reaction. In some cases, the beam induces decomposition of a precursor gas. The precursor gas is preferably stable so that it does not react with the work piece away from the beam impact area. The resolution of the deposit or etching is determined by the beam diameter and region of interaction between the beam and the work piece. "Resolution" is used herein to refer to the smallest feature size that a process can produce.

In beam-induced deposition, the decomposition products include a non-volatile product that remains on the work piece and a volatile product that is eventually removed by the vacuum pump. For example, a gaseous organometallic compound, such as tungsten hexacarbonyl, may be provided near the sample and is adsorbed onto the surface. The beam decomposes the tungsten hexacarbonyl to leave tungsten on the work piece at the points of beam impact.

In beam-induced etching, the precursor gas forms a volatile byproduct with the work piece material, which is eventually removed by the vacuum pump. For example, iodine can be used as a precursor gas to etch silicon, the iodine forming volatile compounds with the silicon in the presence of the beam. Many deposition precursors and etch precursors are known in the art. In some cases, such as a beam of carbon 60 particles, material in the beam are directly deposited onto the surface without disassociating a precursor.

Different types of beams provide different amounts of energy and have different spot sizes at the sample. Higher energies typically correspond to higher etch or deposition rates, but lower resolution. While a charged particle beam can be focused into a much smaller spot than a laser beam, the size of the beam spot on the work piece is typically related to the current in the beam. Beam current is usually determined by the size of an aperture in the beam path. A smaller aperture blocks more of the off-axis particles, which typically do not focus as well as the particles near the axis. Blocking the off-axis particles reduces the beam current. Also, reducing the beam current reduces the tendency of the beam to spread out due to the repulsive force of the charged particles in the beam. Changing the aperture typically requires physically moving a new aperture into the beam path and centering it, which takes some time. In some systems, current may also be controlled by controlling source settings, such as the plasma density or extraction voltage.

A typical focused ion beam system using a liquid metal ion source can produce a current of between about 1 pA to about 100 nA with a spot size of between about 3 nm and 3 mm. A plasma ion focused ion beam source can produce currents between about 1.5 pA to about 1.5 µA with a spot size of between about 4 nm and about 5 mm. Electron beam currents are typically between about 0.5 pA to about 0.5 µA with a spot size from less than a nanometer to about 3 nm. A small, high resolution beam typically has a low current, which produces a low etch or deposition rate. For example, the rate of focused electron beam-induced deposition is typically around about $5 \times 10^{-4}$ $\mu m^3 \cdot nC^{-1}$. An ion beam can typically deposit a film using beam-induced deposition at a rate of up to about one micron per minute.

Three-dimensional structures can be formed by multiple scans of the beam, with additional material being etched or deposited on each scan. Each point to which a beam is addressed is referred to as a "dwell point." The period during which a beam remains at a point is referred to as the "dwell period." The total amount of particles or energy provided to a point is referred to as the "dose," and can refer to the dose during a single dwell period, or to multiple dwell periods. A scan may refer to a raster pattern in which the beam scans over a processing area in a regular pattern, such as a rectangle, or may refer to a scan in which the beam is directed toward individual points in an irregular pattern.

A pattern to be fabricated may be represented by a "bitmap," which shows the dwell points to which the beam is to be directed. The beam can be deflected rapidly across points on the work piece that are not to be addressed, or the beam can be blanked between dwell points. To form a pattern of deposited or etched material, current systems allows a user to specify which points on the X,Y plane to expose and a dwell period specified for each point. When the machine operator desires to form a pattern having both large and small features, the operator needs to select a beam that provides sufficient resolution to produce the finer features, which results in an excessive time for forming larger features that do not require fine resolution.

SUMMARY OF THE INVENTION

An object of the invention is to provide improved beam processing.

In accordance with some embodiments of the invention, the beam current is varied within a single scan during patterning. An analysis of the bitmap is performed to determine which areas of the pattern require a low beam current to produce fine features and which areas of the bitmap can be written at higher beam currents in order to improve throughput. Automatic optimization of the beam path through the bitmap can be achieved by taking into account the trade-off between the time saved from using higher beam currents versus time spent changing the beam current. Embodiments are applicable to fabricating structures using a single scan or to fabricating three-dimensional structures using repeated scans.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
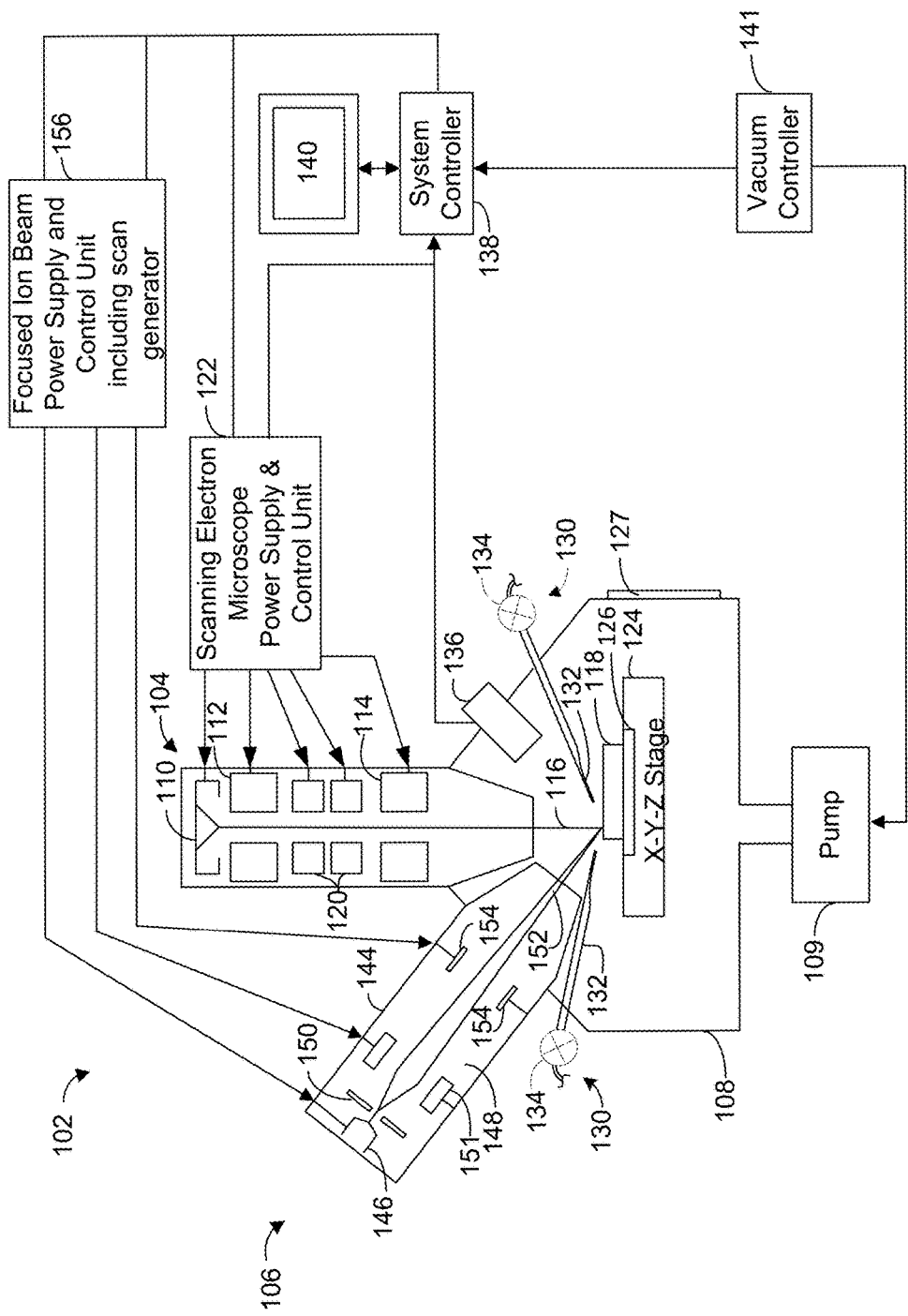
FIG. 1 shows a charged particle beam system that can be used to implement the present invention.

A typical pattern to be fabricated using beam processing may include features of varying size. When patterning a work piece using a charged particle beam, the maximum beam current per pixel is typically determined by the user for the smallest isolated feature that is desired to be fabricated. The beam current used for the smallest features is then applied to the entire pattern, which results in that any large area features would be deposited using the same beam current as the smallest features. This substantially increases the time required to pattern larger areas. Thus, in current systems the beam dwell time can be varied depending on the size of the feature; however, the beam current remains constant resulting in longer processing time than is optimal. Applicants have recognized this problem and in some embodiments vary the beam current within a single scan when the time saved by a larger beam current outweighs the time required to change the beam current In some embodiments, a method is provided for planning a beam path for material deposition in a pattern to be fabricated, referred to as a "structure pattern," which has features. The structure pattern is analyzed to determine the size of the features in the structure pattern. A beam path throughout the structure pattern is configured and the beam current required for each point in the structure pattern is determined. The structure pattern may have features of differing sizes with some features being larger, in area or in volume, than others. The beam current may be varied along the beam path depending on the size of the feature. Configuring the beam current required for each point involves determining the acceptable beam current for that point. For example, material deposition for relatively small features requires low beam current for high accuracy; whereas, relatively large features can be deposited using a higher beam current for faster deposition. Each feature in the structure pattern is deposited at the highest beam current acceptable to allow accurate deposition of the feature. The structure pattern may include multiple planar layers each of which is deposited in a single scan of the beam.

In some embodiments, a method of planning a beam path for processing a work piece with a beam is provided that includes providing a work piece to be processed by a beam, providing a beam system with multiple selectable beam intensities, providing a structure pattern having at least one bitmap to be patterned on the work piece, analyzing each bitmap to determine the optimum beam intensity to be used for each dwell point on the bitmap to create a beam intensity bitmap, analyzing the beam intensity bitmap to isolate regions that can be processed with similar beam intensity, and planning a beam path for the pixelated bitmap for each of the selectable beam intensities.

In accordance with another embodiment, material is deposited in a structure pattern that includes features of varying size. A beam path through the structure pattern is planned and the size of each feature is determined. The beam current required for each point in the structure pattern is varied along the beam path depending on the size of each feature. Configuring the beam current for each point in the pattern involves determining the acceptable beam dose for that point. For relatively small features a low beam current is required for high accuracy and for relatively large features a higher beam current can be used for faster deposition. Each feature in the structure pattern is deposited at the highest beam current acceptable to allow accurate deposition of the feature. The structure pattern may include multiple planar layers each of which is deposited in a single scan of the beam. Because of the time required to change the beam current, the beam current is not chosen based on the requirement of an individual dwell point, but is based on a group of dwell points. That is, it may not be worthwhile to spend the time to increase the beam current at a single dwell point—it may be more efficient to merely increase the dwell period for that single point. If the required resolution of a several of sequential dwell points permit the use of a large beam current, it may be advantageous to invest the time to change the change the beam current for those multiple dwell points.

FIG. 1 shows a dual beam system 102 that can be used to carry out embodiments of the invention. Suitable beam systems are commercially available, for example, from FEI Company, Hillsboro, Oreg., the assignee of the present invention. While an example of suitable hardware is provided below, the invention is not limited to being implemented in any particular type of hardware.

Dual beam system 102 has a vertically mounted electron beam column 104, and a focused ion beam (FIB) column 106 mounted at an angle of approximately 52 degrees from the vertical on an evacuable specimen chamber 108. The specimen chamber may be evacuated by pump system 109, which typically includes one or more, or a combination of, a turbo-molecular pump, oil diffusion pumps, ion getter pumps, scroll pumps, or other known pumping means.

The electron beam column 104 includes an electron source 110, such as a Schottky emitter or a cold field emitter, for producing electrons, and electron-optical lenses 112 and 114 forming a finely focused beam of electrons 116. Electron source 110 is typically maintained at an electrical potential of between 500 V and 30 kV above the electrical potential of a work piece 118, which is typically maintained at ground potential.

Work piece 118 may be, for example, a semiconductor device, micro-electromechanical system (MEMS), or a lithography mask. The impact point of the beam of electrons 116 can be positioned on and scanned over the surface of the work piece 118 by means of deflection coils 120. Operation of lenses 112 and 114 and deflection coils 120 is controlled by scanning electron microscope power supply and control unit 122. Lenses and deflection unit may use electric fields, magnetic fields, or a combination thereof.

Work piece 118 is on movable stage 124 within specimen chamber 108. Stage 124 can preferably move in a horizontal plane (X and Y axes) and vertically (Z axis) and can tilt approximately sixty (60) degrees and rotate about the Z axis. A door 127 can be opened for inserting work piece 118 onto X-Y-Z stage 124 and also for servicing an internal gas supply reservoir (not shown), if one is used. The door is interlocked so that it cannot be opened if specimen chamber 108 is evacuated. Stage 124 may be cooled, for example, by a Peltier cooler (not shown) or heated by, for example, a resistive heater 126.

Mounted on the vacuum chamber are multiple gas injection systems (GIS) 130 (two shown) for holding the precursor or activation materials and a needle 132 for directing the gas to the surface of the work piece. Each GIS further comprises means 134 for regulating the supply of precursor material to the work piece. In this example the regulating means are depicted as an adjustable valve, but the regulating means could also comprise, for example, a regulated heater for heating the precursor material to control its vapor pressure.

Focused ion beam column 106 comprises an upper neck portion 144 within which are located an ion source 146 and a focusing column 148 including extractor electrode 150 and an electrostatic optical system including an objective lens 151. Ion source 146 may comprise a liquid metal gallium ion source, a plasma ion source, a liquid metal alloy source, or any other type of ion source. The axis of focusing column 148 is tilted 52 degrees from the axis of the electron column. An ion beam 152 passes from ion source 146 through focusing column 148 and between electrostatic deflectors 154 toward work piece 118.

FIB power supply and control unit 156 provides an electrical potential at ion source 146. FIB power supply and control unit 156 is coupled to deflection plates 154 which can cause the ion beam to trace out a corresponding pattern on the upper surface of work piece 118. In some systems, the deflection plates are placed before the final lens, as is well known in the art. Beam blanking electrodes (not shown) within ion beam focusing column 148 cause ion beam 152 to impact onto a blanking aperture (not shown) instead of work piece 118 when a FIB power supply and control unit 156 applies a blanking voltage to the blanking electrode.

System controller 138 controls the operations of the various parts of dual beam system 102. Through system controller 138, a user can cause ion beam 152 or electron beam 116 to be scanned in a desired manner through commands entered into a conventional user interface (not shown). Alternatively, system controller 138 may control dual beam system 102 in accordance with programmed instructions stored in computer memory 140. System controller 138 includes a patterning engine that converts a two or three-dimensional model of a structure into a series of bitmaps and then into electrical signals for controlling the ion beam or electron beam. Computer memory 140 may store instructions for carrying out any of the methods described herein. FIG. 1 is a dual beam system shown and described in U.S. Pat. No. 8,853,078, which is assigned to the assignee of this invention and is hereby incorporated by reference, and is just one example of a dual beam system for use with the present invention.

Figure 2:
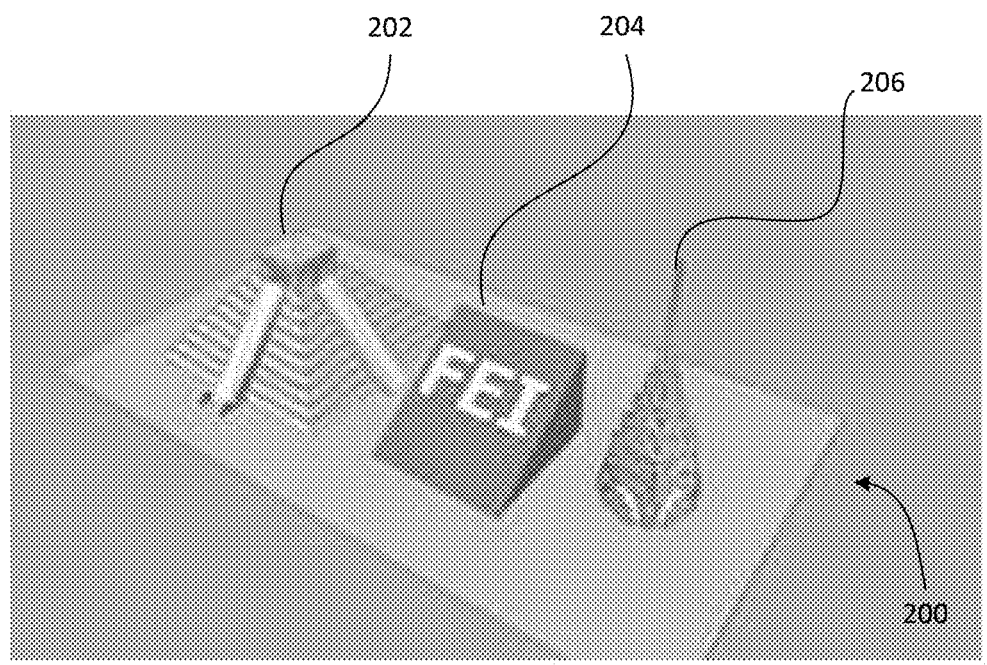
FIG. 2 is a representation of a 3-D CAD model used to form a pattern for 3-D material deposition.

FIG. 2 shows a 3-D computer-aided design (CAD) model 200 used to form a 3-D pattern by material deposition. Model 200 includes features 202, 204, 206 of varying shapes and sizes. To produce the three-dimensional bitmap, model 200 may be divided into multiple planar layers, which taken together represent the three dimensional model. Each layer may then be sent to the patterning engine and configured as a bitmap of the desired pattern. This process can be carried out using a GCODE generator program from the ReplicatorG open source 3D printing software that is available at replicat.org/generators, or, if unavailable, at www.archive.org.

Figure 3:
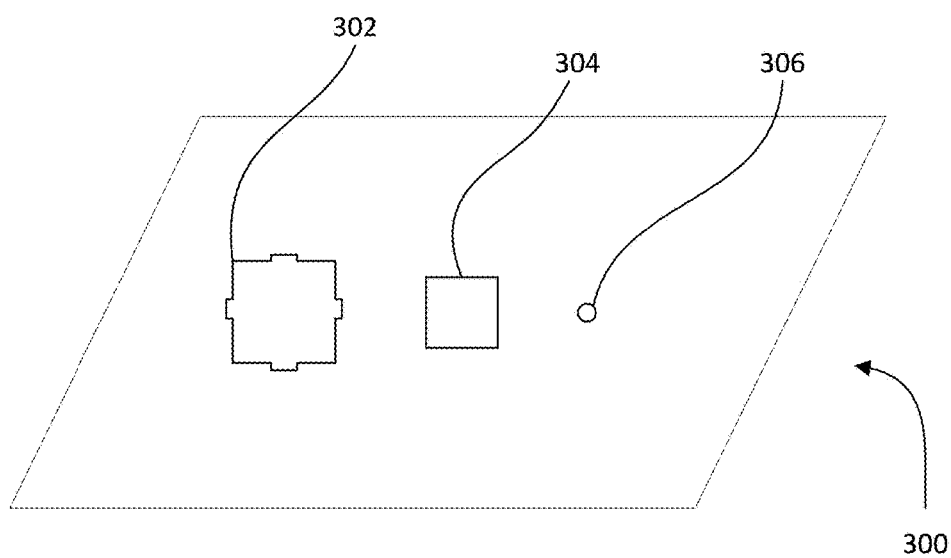
FIG. 3 is schematic of a layer having features of different sizes.

FIG. 3 shows a bitmap formed from a planar horizontal layer taken from model 200 in which region 302 corresponds to one level of feature 202, region 304 corresponds to one level of feature 204, and region 306 corresponds to one level of feature 206. The patterning algorithm of the beam system determines which points on each of the planar layer to expose to a specific beam current along the beam path. The bitmap is then patterned, that is, "written," by either the electron beam or ion beam, as appropriate. The patterning could be formed by depositing material or etching material from the surface, or some combination of the two.

Figure 4:
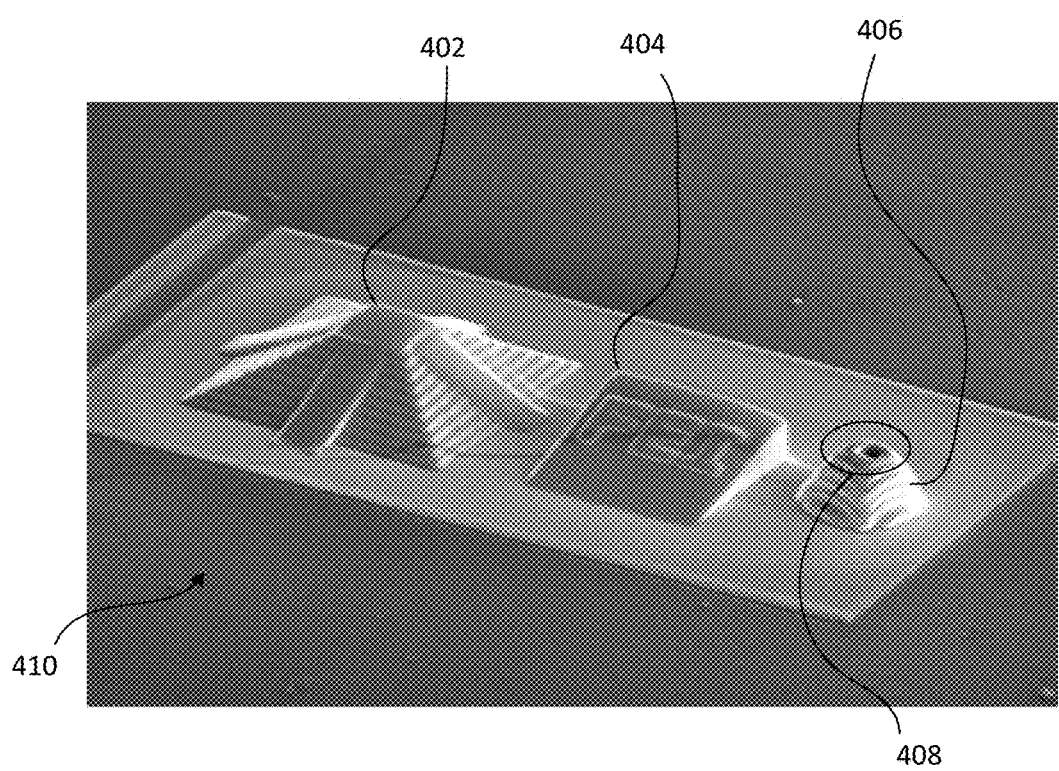
FIG. 4 shows 3-D structures formed from a material deposition process.

FIG. 4 shows an example of a 3-D structure produced from model 200 (FIG. 2) using a prior art method. The model was divided into layers, with a bitmap corresponding to each layer. The same dwell period and beam current is used for all dwell points in each bitmap. The dose, that is, the dwell period times the current, was set at a higher level to reduce processing time. It can be seen, however, that the small spire portion of feature 206 was not formed properly because the dose per pixel was too high. This could have been corrected by setting the global dose lower but the patterning would then have taken much longer. Varying the beam current within the bitmap pattern allows for larger scale features to be formed at a higher current (and a smaller dwell period) while smaller scale features are formed at a lower beam current. This results in higher pattern fidelity with higher throughput.

In one embodiment of the invention, a required beam dose for each dwell point is determined by the patterning engine. The patterning engine then determines how the dose is achieved by setting a combination of the current and the dwell period to achieve the dose. The beam scans all the high current pixels in a layer and then scans all the low current pixels. When the spot size needs to be small or can be large without consequences, it is preferable to change the beam current because throughput is increased. It is preferable to adjust the dwell time when having a large spot size is undesirable. For example, region 306 (FIG. 3) represents the small spire of feature 206 (FIG. 2). Typically, smaller features require a lower beam current to achieve accurate material deposition. Larger features, such as region 302 (FIG. 3) can be deposited with a higher beam current, which can provide a higher dose with a shorter dwell time. Setting the global dose lower would result in accurate material deposition; however, this would substantially increase the production time on the order of several hours. A higher global dose reduces processing time but errors can occur resulting in an inaccurate material deposition.

Figure 5:
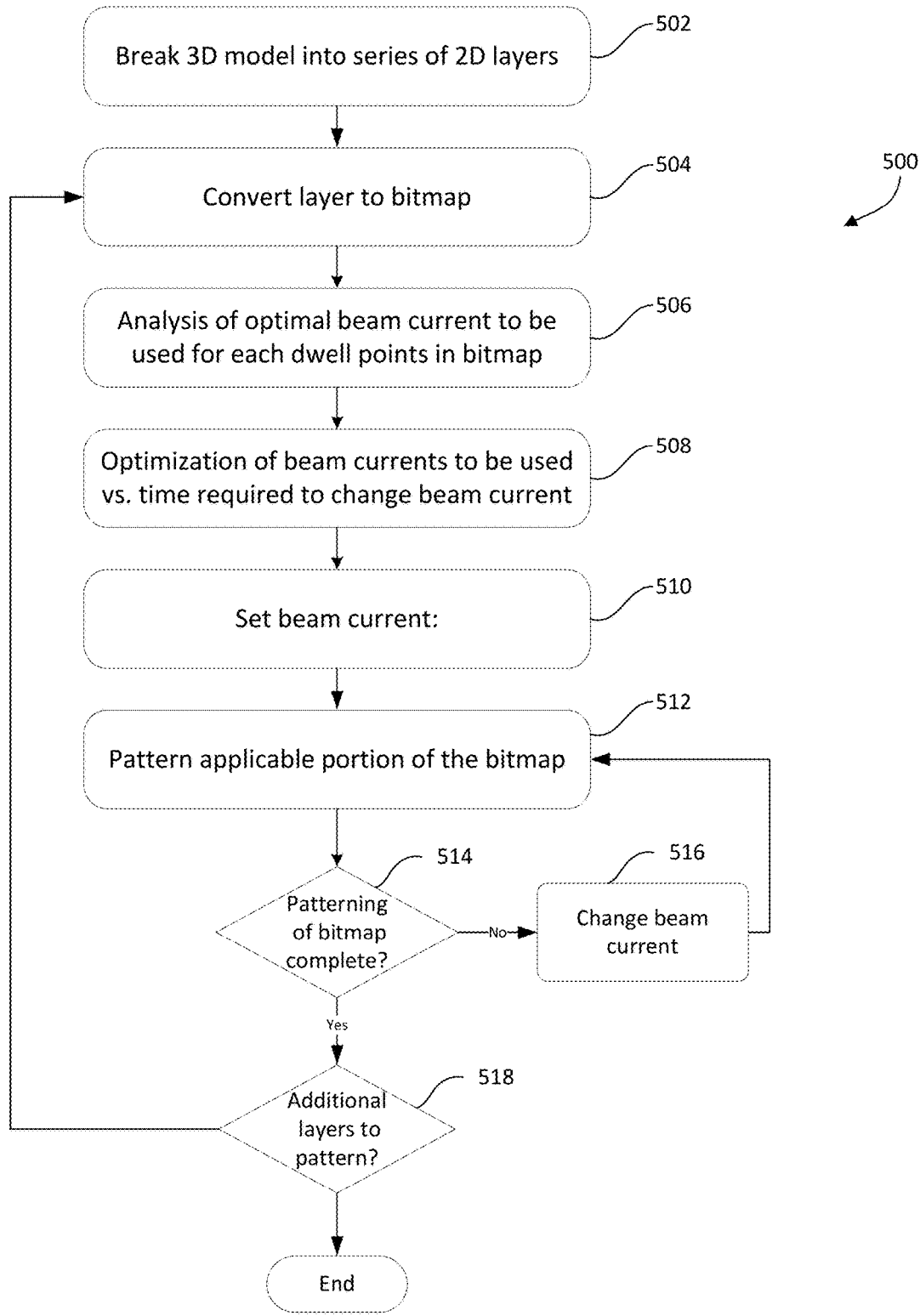
FIG. 5 is a flow chart showing the steps of implementing the method of the invention.
Figure 6:
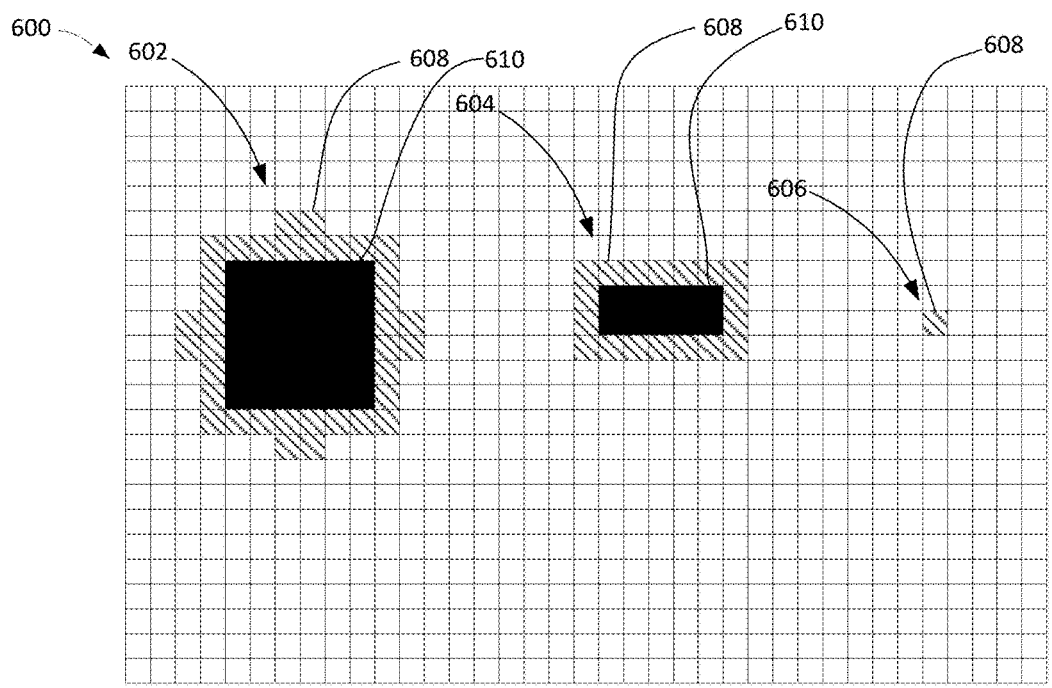
FIG. 6 shows a patterning layer converted to a bitmap, with preferred beam currents for each of the dwell points on the bitmap.

FIG. 5 shows a flow chart 500 describing the steps of an embodiment of the invention. In step 502, a three-dimensional model is broken down into layers. In step 504, a bitmap is created corresponding to the first layer. In step 506, each of the dwell points on the bitmap is analyzed to determine an optimal beam current and dwell time for that dwell point. The optimal current is determined by the surrounding dwell points. FIG. 6 shows a bitmap having features 602, 604, and 606. Dwell points 608 shown in cross hatching are optimally written using a low beam current and dwell points 610 shown in solid black are optimally to be written with a high beam current. Various methods can be used to determine the optimal beam current for each dwell point. Dwell points within a certain number of dwell points from the edge of the feature are preferably written using a low beam current to define a sharp edge to the feature. In FIG. 6, dwell points that touch the edge or that have a corner touching the edge of the feature are written with a low current.

Depending on the beam system, it may take between about one minute and five minutes to change the current by physically changing the beam-defining aperture in the beam path. It is therefore not efficient to apply the beam currents and dwell times calculated in step 506 and shown in FIG. 6. For example, in a focused ion beam system using a plasma ion source, a high beam current is typically between about 100 pA and about 1 mA using a beam-defining aperture (BDA) having a diameter of between about 1 μm and 1 mm, with a typical operation having a current of about 1 μA using a BDA having a bore diameter of about 100 μm. A low current may be between about 1 pA and 100 nA, using a BDA having a diameter of between about 1 μm and 1000 μm, with a typical operation having a beam current of about 80 nA using a BDA diameter of about 100 μm.

If the dwell period is 3 ms and the current is increased by a factor of 15, the dwell period can be reduced to 200 ns (3 ms×1/15) to deliver the same dose, a time saving of 2.8 ms. To recover the time required to change the aperture, for example, 60 seconds, the number of dwell points benefitting from the higher current would need to be at least 60 seconds divided by 2.8 ms, or 21,500 dwell points. For example, a pattern consists of not a single pass but multiple thousands of passes. For a pattern or layer with 1,000 passes, consisting of 500×500 pixels, equates to 250 million total dwell points, making the beam current switch very time effective. As discussed above, the entire pattern or structure which is desired to be written is split into layers. The layer thickness is targeted to be 10-50 nm depending on desired pattern fidelity. Therefore a pattern may have, say, 100 layers, and each layer will have the beam pass over it say from tens to thousands of times.

In step 508, the beam currents and dwell times to be used at each dwell point are determined by balancing the increased throughput from increasing the beam current against the time required to change the current.

Figure 7:
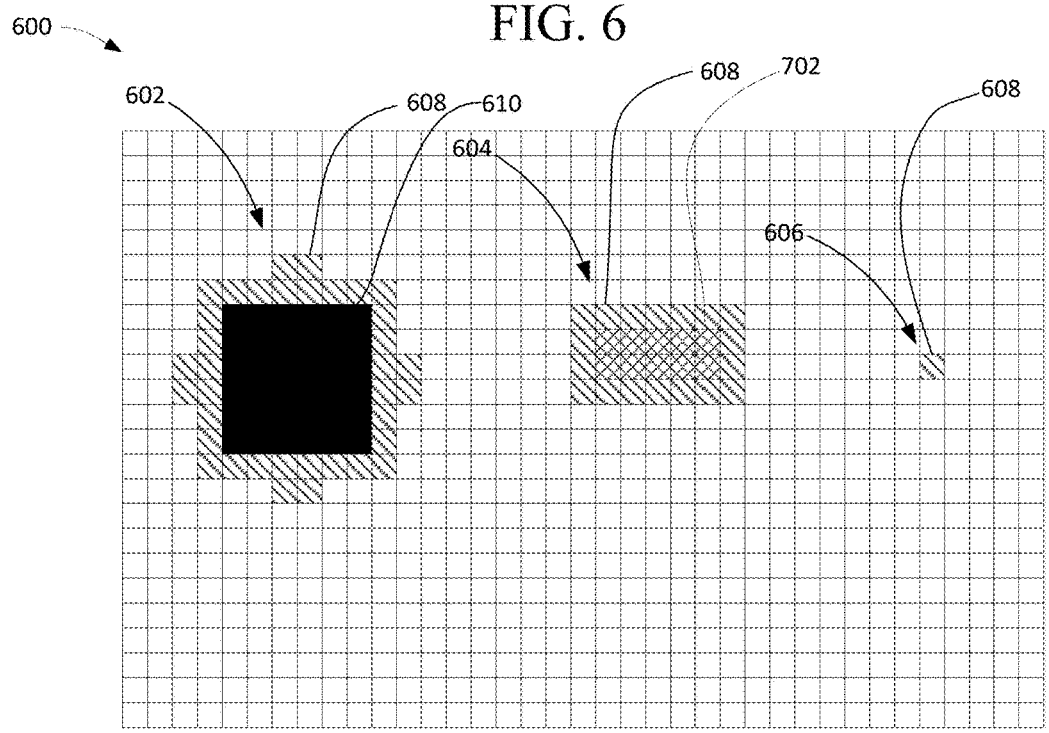
FIG. 7 shows the bitmap of FIG. 6 with the current for each dwell point optimized based on the time to change the current and the preferred current per dwell point.

FIG. 7 shows, for example, that the dwell points 702, shown with a cross pattern, although optimally patterned using a high beam current, will be patterned using a low beam current because the reduced dwell time does not compensate for the time required to change the aperture.

In step 510, a beam is set and the portion of the pattern that is to be scanned at that beam current is scanned in step 512. If the patterning of that lawyer is determined to not yet be complete in decision block 514, then the beam current is changed in block 516 and the work piece is patterned again in step 512 at the new beam current. If it is determined in decision block 514 that the patterning of the layer is complete, it is determined in decision block 518 whether there are additional layers to pattern. If so, the next layer is converted to a bitmap in step 504 and the process repeats. When it is determined in decision block 518 that all layers have been patterned, the process is ended.

Preferably, breaking the model into layers and converting the layers into bitmaps is performed automatically by the system controller or another computer. While the model shown in FIG. 2 is produced by beam-induced deposition, other embodiments use beam-induced etch.

While the example describes switching between two current levels, other embodiments can use 3, 4 or more current levels, including in some embodiments a continuous range of current values. It is also known that the beam current can determine whether material is deposited in the presence of a precursor gas or etched. A large current can exhaust the precursor gas adhered to the substrate and remove substrate material faster than material is deposited. Changing the beam current can be used to in some embodiment to switch from a deposition process to an etch process.

Although the present invention and its advantages have been described in detail, it should be understood that various changes, substitutions and alterations can be made herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A method of beam-induced material deposition, comprising:
    creating a map specifying two-dimensional features to be deposited on a surface by a charged particle beam having a beam current that can be varied, the two-dimensional features including a first feature and a second feature having different sizes;
    analyzing the map to determine the sizes of the first and second features;
    using the size of the first feature to determine a first beam current at which to deposit the first feature, and the size of the second feature to determine a second beam current at which to deposit the second feature, the second beam current being different than the first beam current, wherein the first beam current and second beam current are each chosen based a current requirement of a group of dwell points and not based on a current requirement of an individual dwell point;
    depositing the two-dimensional features by scanning the charged particle beam over the surface according to a scan pattern, the scan pattern grouping wherein the beam deposits the first feature by scanning a first region of the surface at the first beam current, and the second feature by scanning a second region of the surface at the second beam current;
    wherein the beam current is varied between the first beam current and the second beam current within a single scan of the scan pattern.

2. The method of claim 1, further comprising changing the current of the charged particle beam from the first beam current to the second beam current by changing a size of a beam-defining aperture in a path of the charged particle beam to the surface.

3. The method of claim 2, wherein scanning the first region comprises scanning different points in the first region at different dwell times.

4. The method of claim 1, further comprising:
providing a description of a three-dimensional structure; and
dividing the three-dimensional structure into multiple two-dimensional layers,
wherein the map specifying the two-dimensional features is a map of one of the two-dimensional layers.

5. The method of claim 1, further comprising:
providing a description of a three-dimensional structure to be deposited on the surface;
creating bitmaps of different planar layers of the three-dimensional structure, which taken together represent the three-dimensional structure, wherein the map of the two-dimensional features is a bitmap of one of the planar layers; and
forming the three-dimensional structure by performing the steps of claim 1 for each bitmap.

6. The method of claim 1, wherein the charged particle beam deposits several of the features while at the first beam current and then deposits several of the features while at the second beam current.

7. A method of beam-induced material processing, comprising:
providing a structure pattern having features of varying sizes;
analyzing the structure pattern to determine the size of the features in the structure pattern,
determining a beam path to deposit the structure pattern;
determining a beam current required for each point in the structure pattern, wherein the beam currents required by at least two of the points in the structure pattern are different;
determining which points in the structure pattern have a similar required beam current;
scanning the beam along the beam path for a first group of points having a similar required beam current using the determined beam current at each of the first group of points in the structure pattern;
switching the beam current and scanning the beam along the beam path for a second group of points have a similar required beam current, wherein switching between the different beam currents determined for different points in the structure pattern is carried out by changing a size of a beam-defining aperture through which the beam passes while scanning the beam along the beam path; and
wherein the beam current is switched between the different beam currents within a single scan of the structure pattern.

8. The method of claim 7, wherein the beam current varies at different points in the structure pattern according to the size of the feature containing the point.

9. The method of claim 7, wherein the beam-induced material processing comprises material deposition.

10. The method of claim 9, wherein the structure pattern comprises multiple planar layers, each of which will be deposited in a single scan of the beam.

11. The method of claim 10, wherein the beam current varies during a single scan of the beam path.

12. A method of processing a work piece with a beam, comprising:
providing a bitmap to be patterned on the work piece using the beam, the bitmap corresponding to a planar layer of a structure pattern;
analyzing the bitmap to create a beam current bitmap that specifies a beam current at which to pattern each pixel of the bitmap onto the work piece;
analyzing said beam current bitmap to determine regions on the work piece to be processed by the beam with similar beam current, each region comprising a plurality of dwell points;
planning a single path on the work piece for the beam to scan that will pattern the planar layer on the work piece using at least two different beam currents; and
directing the beam along the path at the selected beam currents for each region to process the work piece, at least two different beam currents being used at different points along the path to process the work piece, wherein one region is processed before the beam current is changed for processing another region.

13. The method of claim 12, further comprising switching between the at least two different beam currents by changing a size of a beam-defining aperture through which the beam passes when processing the work piece.

14. The method of claim 12, in which directing the beam along the planned path comprises using different dwell times to process different points along the path.

15. The method of claim 12, in which the bitmap is a first bitmap and the structure pattern is a description of a three-dimensional structure to be patterned on the work piece, further comprising:
creating additional multiple bitmaps, each bitmap corresponding to a different planar layer of the structure pattern, which taken together with the first bitmap represent the three-dimensional structure.

16. The method of claim 15, further comprising, for each of the additional bitmaps:
analyzing the additional bitmap to create an additional beam current bitmap that specifies, for each pixel of the additional bitmap, a beam current at which to process the position on the work piece corresponding to the pixel when patterning the planar layer of the additional bitmap;
analyzing said additional beam current bitmap to determine regions on the work piece to be processed with similar beam current;
planning a beam path for processing the work piece that will pattern the planar layer of the additional bitmap on the work piece; and
directing the beam along the beam path planned for patterning the planar layer of the additional bitmap at the selected beam currents to process the work piece, at least two different beam currents being used in the planned beam path for processing the work piece, and changing from one beam current to another being carried out by changing a size of a beam-defining aperture through which the beam passes when processing the work piece.

* * * * *